US011177987B1

(12) United States Patent
Jefremow et al.

(10) Patent No.: US 11,177,987 B1
(45) Date of Patent: Nov. 16, 2021

(54) RESOLVER SIGNAL PROCESSING (71) Applicant: Infineon Technologies AG, Neubiberg (DE)

(72) Inventors: Mihail Jefremow, Augsburg (DE); Michael Augustin, Villach (AT); Ketan Dewan, Unterhaching (DE); Ralph Mueller-Eschenbach, Munich (DE); Juergen Schaefer, Oberhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/081,433

(22) Filed: Oct. 27, 2020

(51) Int. Cl.
| *H04L 5/12* | (2006.01) |
| *H04L 23/02* | (2006.01) |
| *H04L 27/06* | (2006.01) |
| *H04L 27/08* | (2006.01) |
| *H03M 1/64* | (2006.01) |
| *H04L 27/00* | (2006.01) |

(52) U.S. Cl.
CPC .......... *H04L 27/066* (2013.01); *H03M 1/645* (2013.01); *H04L 27/0002* (2013.01); *H04L 27/08* (2013.01)

(58) Field of Classification Search
CPC ... H04L 27/066; H04L 27/08; H04L 27/0002; H03M 1/645
USPC ......................................................... 375/219
See application file for complete search history.

(56) References Cited

U.S. PATENT DOCUMENTS

| 2012/0010849 A1* | 1/2012 | Yamada | ............... G01D 5/2073 702/151 |
| 2012/0197591 A1* | 8/2012 | Shinohara | ............ G01D 5/2451 702/151 |
| 2013/0249452 A1* | 9/2013 | Shinohara | ............ G01D 5/2073 318/400.04 |
| 2017/0343384 A1* | 11/2017 | Nakazato | ............... G01D 5/244 |

* cited by examiner

Primary Examiner — Tanmay K Shah
(74) Attorney, Agent, or Firm — Schiff Hardin LLP (57) ABSTRACT Processing a resolver signal by a microcontroller includes generating, by a carrier signal generator, a carrier signal for output to a resolver; receiving modulated carrier signals from a resolver via hardware that is external to the microcontroller; integrating, by an integrator, respective integrator input signals which are based on the modulated carrier signals, to generate respective envelope signals, wherein a start of an integration window of the integrator is set with respect to a start of the carrier signal; and determining an angular position sensed by the resolver based on the envelope signals.

20 Claims, 6 Drawing Sheets

FIG. 4
Method for Processing a Resolver Signal

410 Generating a carrier signal for output to a resolver.

420 Receiving modulated carrier signals from a resolver via hardware that is external to the microcontroller.

430 Integrating respective integrator input signals which are based on the modulated carrier signals, to generate respective envelope signals, wherein a start of an integration window of the integrator is set with respect to a start of the carrier signal.

440 Determining an angular position sensed by the resolver based on the envelope signals.

450 Compensating for the determined constant angular position error.

RESOLVER SIGNAL PROCESSING

BACKGROUND

The present disclosure is directed to resolver signal processing. Microcontrollers suffer from external hardware delays that during demodulation cause amplitude modulated carrier signals received from a resolver to not be in synchronization with original carrier signals. This results in angular position calculations based on the demodulated signals being erroneous.

BRIEF DESCRIPTION OF THE DRAWINGS

FIGS. 2A-2C illustrate signal diagrams showing effects of external hardware delays on resolver signal demodulation.

FIGS. 3A-3C illustrate schematic and signal diagrams for external hardware delay measurement for a rectifier and integrator of the microcontroller of FIG. 1.

DETAILED DESCRIPTION

The present disclosure is directed to microcontroller configured to demodulate a resolver signal in a manner that is insensitive to delays caused by external hardware.

Figure 1:
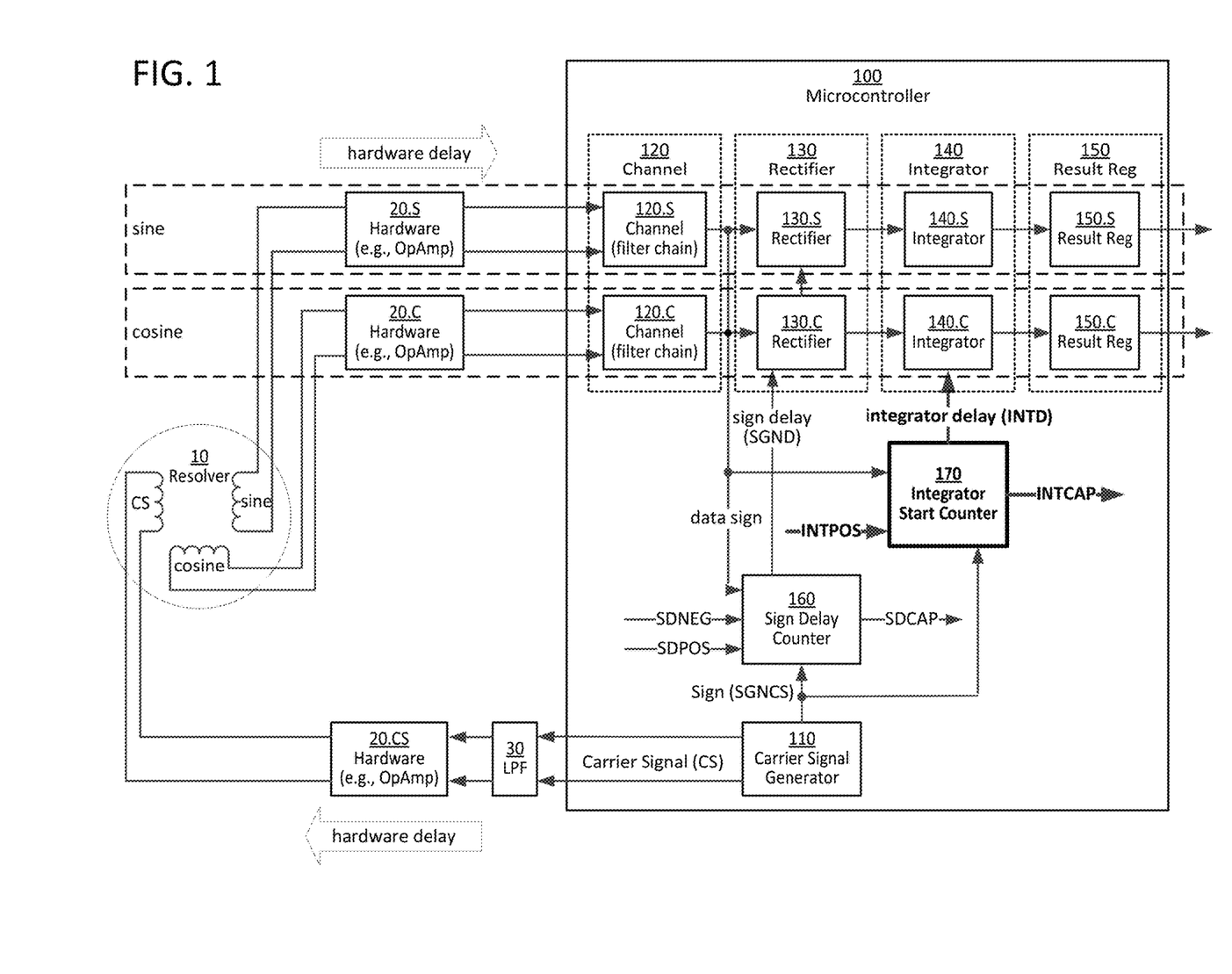
FIG. 1 illustrates a schematic diagram of a microcontroller for processing a resolver signal.

FIG. 1 illustrates a schematic diagram of a microcontroller 100 for processing a resolver signal.

The microcontroller 100 is coupled to a resolver 10 via a low pass filter 30 and external hardware 20. It is appreciated that the disclosure is not limited to these particular elements; there may be other or alternative elements which are not shown for the sake of brevity.

During operation, a carrier signal generator 110 of the microcontroller 100 is configured to generate a carrier signal CS for output to the resolver 10. The low pass filter 30 filters the carrier signal CS, and the carrier signal hardware 20.CS amplifies the filtered carrier signal CS before the carrier signal CS is applied to the resolver 10.

The resolver 10 is configured to measure an angular position of a rotatable shaft (rotor). The resolver 10 has three distinct coil windings—a primary winding (reference winding for carrier signal CS) and two secondary windings (sine and cosine windings for sine and cosine signals, respectively). The sine and cosine windings are mounted 90° from each other in relation to the shaft. The reference winding is mounted on the shaft and in operation is excited by the carrier signal CS applied thereto. As the shaft rotates, the excited reference winding induces voltages in the sine and cosine windings vary sinusoidally, thereby generating sine and cosine signals, which are amplitude modulated (AM) carrier signals output as the resolver signal. The sine hardware 20.S and cosine hardware 20.C amplify the sine and cosine resolver signals, respectively. After demodulation by the microcontroller 100, the sine and cosine signals may be used to calculate a rotational angle θ of the shaft (sine θ/cosine θ=tangent θ).

The hardware 20 includes the carrier signal hardware 20.CS, sine hardware 20.S, and cosine hardware 20.C. The hardware 20 comprises components, such as operational amplifiers. Although the hardware 20 is shown as three separate devices, the disclosure is not limited in this respect. This hardware 20 is external to the microcontroller 100 and may cause delays between the original carrier signal CS and the resolver signal (amplitude modulated carrier signal) received back at the microcontroller 100. These delays, which may be due to changes in temperature and/or manufacturing variations, can negatively impact the accuracy of the detected rotatable shaft angular position. And since these delays are variable, the accuracy is variable, thereby making compensation using software difficult. The microcontroller 100 is configured to demodulate the resolver signal in a manner that is insensitive to these external hardware delays.

The microcontroller 100 comprises the carrier signal generator 110, a sign delay counter 160, and an integrator start counter 170. The microcontroller 100 also comprises for each of the sine signal processing and cosine signal processing, a channel 120 (120.S and 120.C), a rectifier 130 (130.S and 130.C), an integrator 140 (140.S and 140.C), and a result register 150 (150.S and 150.C), which each may be a single device or separate devices for the sine and cosine signal demodulation. The microcontroller elements may form a Delta-Sigma Analog-to-Digital Converter (DSADC), or any other converter as suitable.

Accurate demodulation is dependent on demodulation stages using multiples of the original (unmodulated) carrier signal frequency. Demodulation stages and the carrier signal generator 110 should therefore be enabled simultaneously. The external hardware delays may cause a shift in starts of integration windows of the microcontroller's integrator 140, causing the integration window to be not in synchronism with the zero cross of the delayed carrier signal CS and therefore also with amplitude modulated signals, resulting in angle calculation inaccuracies.

By way of overview, the microcontroller 100 compensates for the external hardware delays by shifting the timing relationship between the starting points of the carrier signal CS and the integration window of the integrator 140 to be in a predetermined relationship to guarantee the synchronism between the integration window of the integrator and the delayed carrier signal. The envelope signal, which is the integrated signal output by the integrator 140, will then have a constant angle error rather than a variable one, and this constant error is more easily be compensated for using software.

Figure 2A:
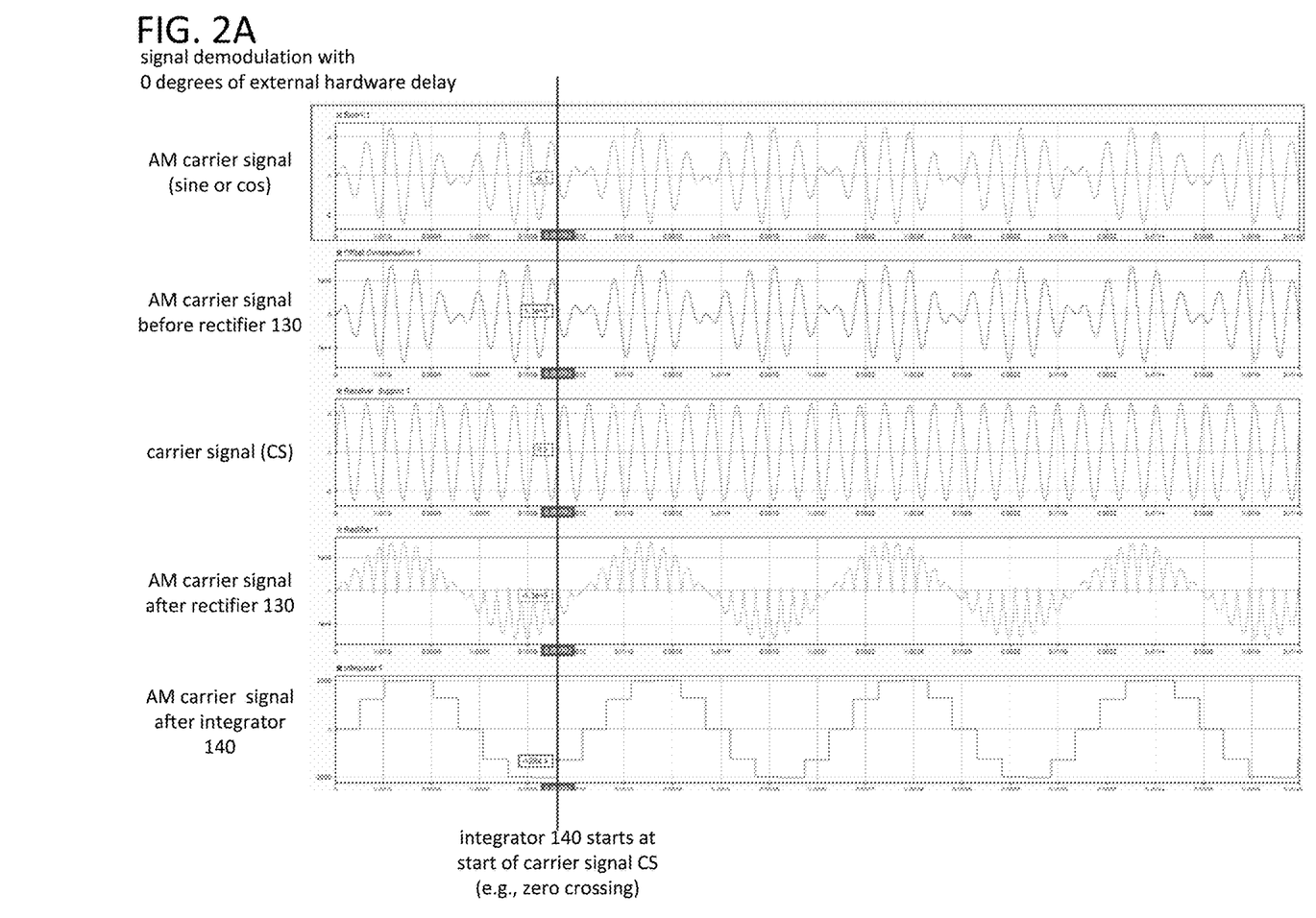
FIG. 2A illustrates signal diagrams of resolver signal demodulation with 0 degrees of external hardware delay.
Figure 2B:
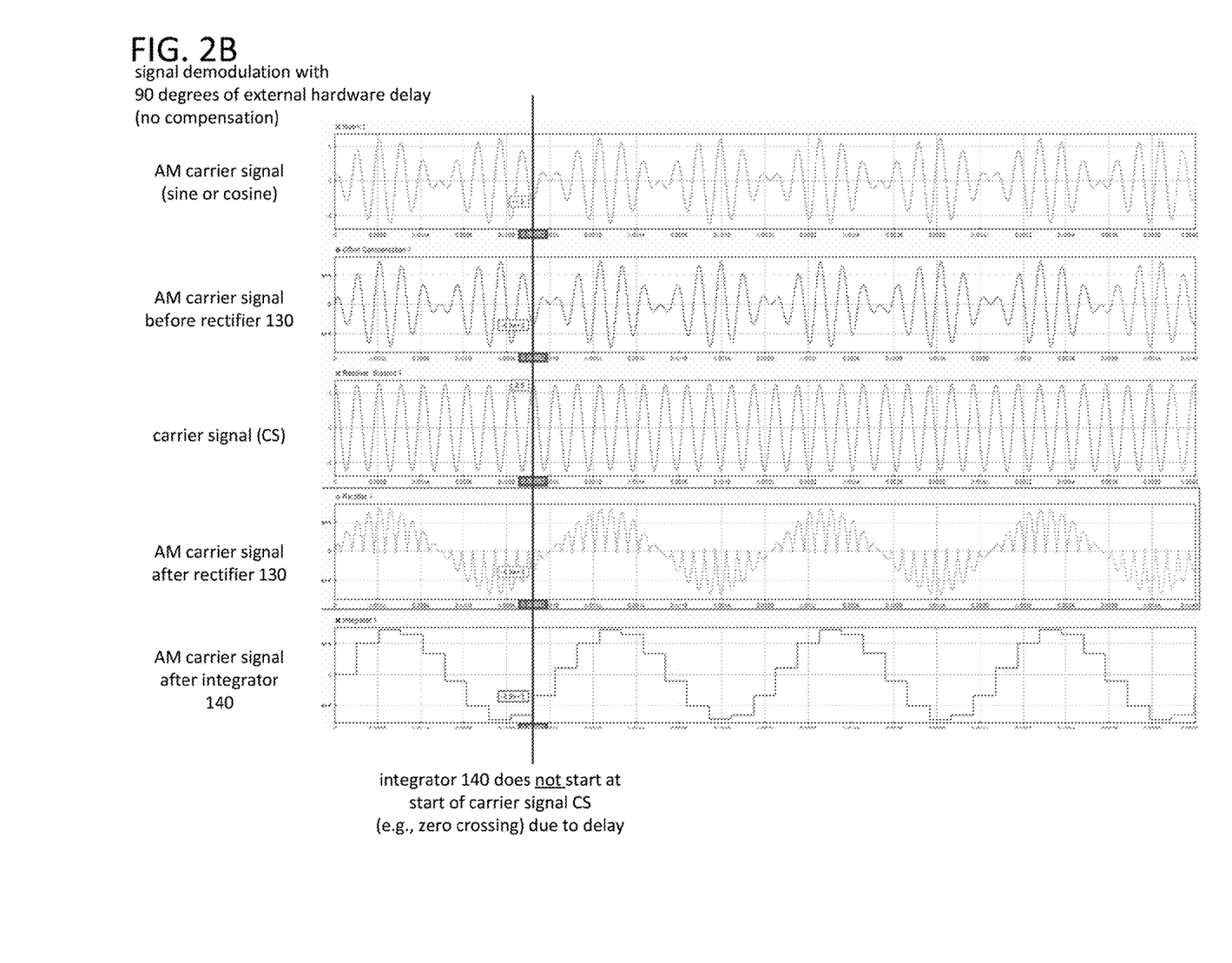
FIG. 2B illustrates signal diagrams of demodulation with 90 degrees of external hardware delay.
Figure 2C:
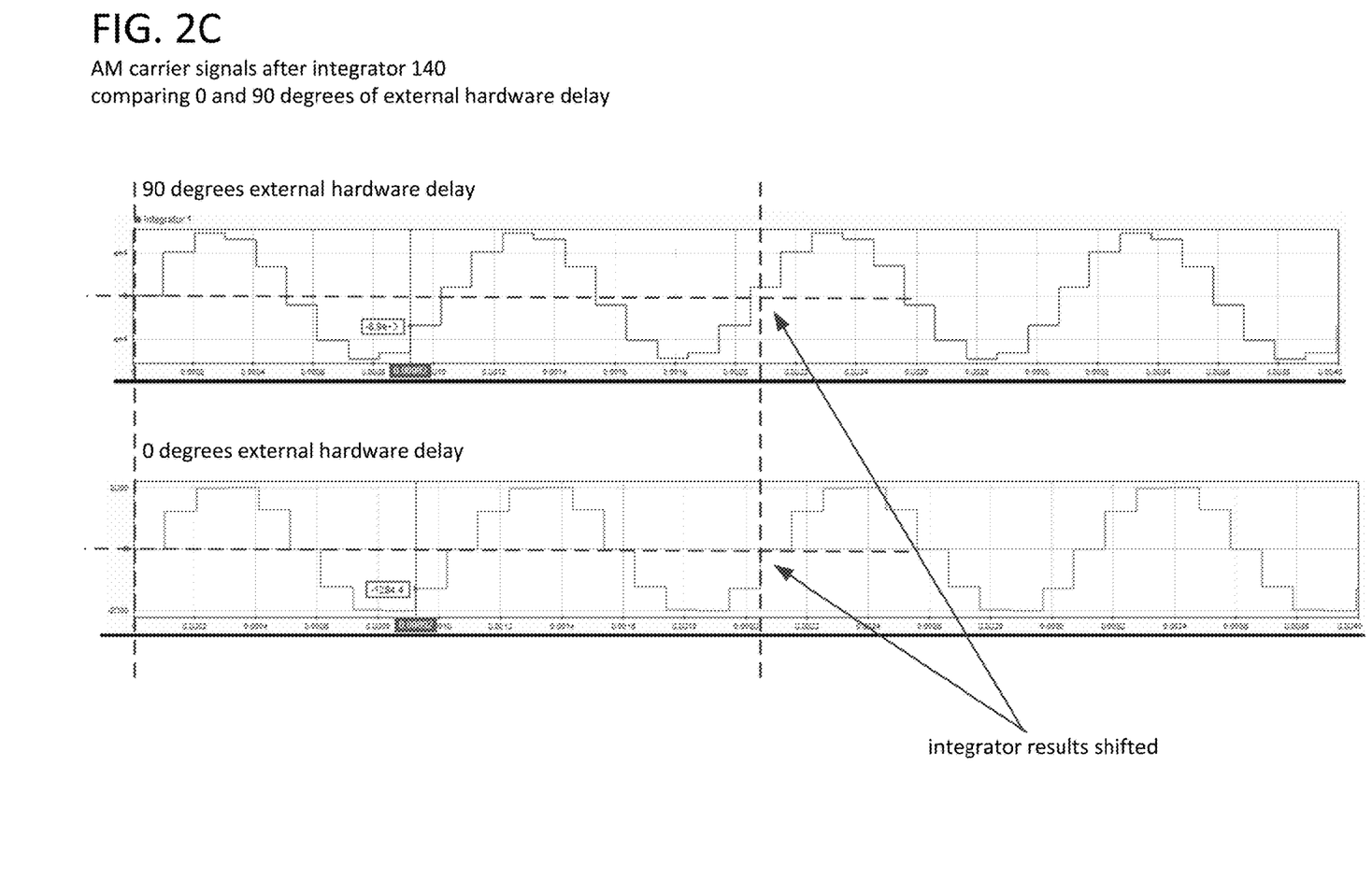
FIG. 2C illustrates a comparison of signal diagrams of integrated demodulated carrier signals with 0 and 90 degrees of hardware delay.

FIGS. 2A-2C illustrate signal diagrams showing effects of external hardware delays on resolver signal demodulation. Comparing FIG. 2A (0 degrees of external hardware delay) with FIG. 2B (90 degrees of external hardware delay with no compensation), the external hardware delay is evident. The "carrier signal (CS)" represents the delayed signal output of the carrier signal generator 110, and the "AM carrier signal (sine or cosine)" represents the amplitude modulated carrier signal output by the resolver 10, which has a delay in the case of FIG. 2B. Along the vertical solid line of FIG. 2A, the zero crossings of the "AM carrier signal (sine or cosine)" correspond with those of the original carrier signal CS because there is no delay. On the other hand, in FIG. 2B, the zero crossings of the "AM carrier signal (sine or cosine)" do not correspond with those of the original carrier signal CS; the AM carrier signal is shifted due to the external hardware delay. And FIG. 2C illustrates a comparison of signal diagrams of integrated demodulated carrier signals with 0 and 90 degrees of hardware delay. The integrator 140 starting its integration window with a delay, as illustrated in the upper signal diagram, results in an integration of a same number of data values, but the integration window includes data values from the following carrier period. This delay results in a change in angle error, and thus angle calculation imprecision. The microcontroller 100 disclosed herein is designed to compensate for this external hardware delay.

The microcontroller 100 is configured to process both the sine and cosine signals output by the resolver 10 as the resolver signal. The following description refers to the sine/cosine signal processing generically for ease of description, but is equally applicable to each of these component signals of the full resolver signal.

The channel 120 receives the AM carrier signal (resolver signal comprising AM sine and cosine signals) after being amplified by the external hardware 20.S, 20.C. The channel 120 comprises a filter chain configured to filter the modulated carrier signal. The filter chain is started in a fixed timing relation with the carrier signal generator 110 to maintain coherency.

The rectifier 130 is configured to rectify the filtered AM carrier signal by flipping the AM carrier signal when the original carrier signal CS is negative, as can be seen in the "AM carrier signal after rectifier 130" signals shown in FIGS. 2A and 2B. The sign delay counter 160 of FIG. 1 is configured to synch the rectifier 130 with the original carrier signal.

Figure 3A:
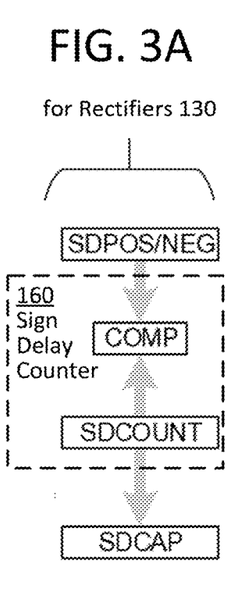
FIG. 3A illustrates a schematic diagram of a rectifier sign delay counter.
Figure 3B:
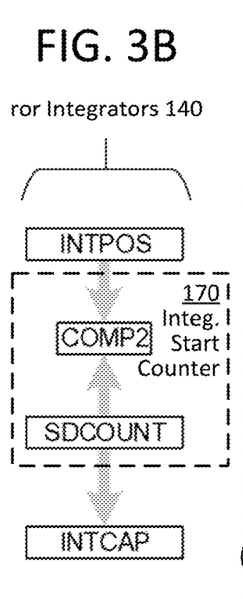
FIG. 3B illustrates a schematic diagram of an integrator start counter.
Figure 3C:
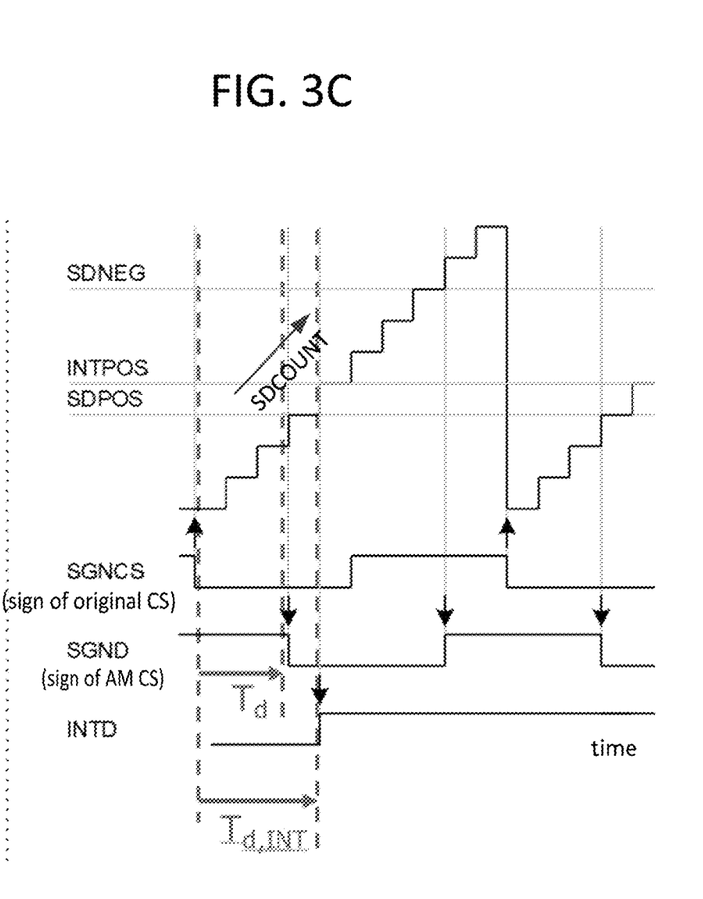
FIG. 3C illustrates corresponding signal diagrams.

FIG. 3A illustrates a schematic diagram of the sign delay counter 160, and FIG. 3C illustrates corresponding signal diagrams. The sign delay counter 160 is configured to control the rectifier 130 to rectify in a manner that compensates for the external hardware delay by delaying the rectification by a rectification delay $T_d$.

COMP is a comparator, SDCOUNT is a counter, and SDPOS/NEG is a register for storing preprogrammed user-defined threshold values (SDPOS and SDNEG) related to the external hardware delay. SDPOS and SDNEG are generally equidistant, but may alternatively be different in a case of skewed signals. The user measures the external hardware delay in the complete system, with the microcontroller 100 coupled to the resolver 10, in advance to determine the SDPOS/NEG values, and then programs these values to be used during rectification synchronization.

When the rectifier 130 is rectifying the filtered AM carrier signal, the counter SDCOUNT counts a number of clock ticks over one carrier period of the original carrier signal CS, and at the end of the carrier period restarts the count. The counter SDCOUNT knows when to restart the count based on a zero crossing (from positive to negative) of the original carrier signal CS, which is known from the carrier signal sign signal SGNCS received from the carrier signal generator 110. The comparator COMP compares each counter value with the programmed threshold values SDPOS and SDNEG to determine when the rectifier 130 should flip the sign of the AM carrier signal. Based on the comparison, the sign delay counter 160 outputs the delayed carrier generator sign SGND to the rectifier 130 as either positive or negative. More specifically, when the counter SDCOUNT value reaches the SDPOS value, the sign of the AM carrier signal CS changes from positive to negative, and the rectifier 130 starts flipping the AM carrier signal. And then when the count value reaches the SDNEG value, the sign of the AM carrier signal CS changes in the opposite direction, from negative to positive, and the rectifier 130 stops flipping the AM carrier signal. The cycle then repeats for the next period. The rectification delay $T_d$, which is the time value between the change in sign (positive to negative indicating start) of the original carrier signal SGNS and when the count value SDCOUNT reaches SDPOS, is stored in register SDCAP.

The integrator 140 is configured to integrate a signal from the rectifier 130 over a carrier period to generate an envelope signal, which is subsequently stored in the result register 150 before being used to determine the angular position of the shaft. A start of the integration window is ideally set to be in synchronism with a start of the carrier signal CS. But since the AM carrier signal after the rectifier 130 is not always at the same position, and the integrator 140 conventionally is integrating blindly, an external hardware delay results in the integration window of one carrier period spanning two different carrier periods. While this example discloses integrating over a time corresponding with a single carrier period, this is just an example; the disclosure is not limited in this respect. The integrator start counter 170 of FIG. 1 is configured to synch the integrator 40 with the original carrier signal.

FIG. 3B illustrates a schematic diagram of the integrator start counter 170, and FIG. 3C illustrates corresponding signal diagrams. The integrator start counter 170 is coupled between the carrier signal generator 110 and the integrator 140. The integrator start counter 170 is configured to measure the external hardware delay to be used to control the integrator 140 to start its integrator window to be in synchronism with the start of the original carrier signal CS. This is accomplished by delaying the start of the integration window by an integration delay $T_{d,INT}$.

COMP2 is a comparator, SDCOUNT is the counter described above, and INTPOS is a register for storing a preprogrammed user-defined threshold value related to the external hardware delay. The user this measures the external hardware delay in the complete system in advance to determine the INTPOS value, and then programs this value to be used during integration synchronization.

When the integrator 140 is integrating the rectified AM carrier signal, the SDCOUNT counts a number of clock ticks over one carrier period of the original carrier signal CS as described above with respect to the rectifier 130. The comparator COMP2 compares each counter value with the programmed threshold value INTPOS to determine when the integration window should start. When the comparator COMP2 determines that the SDCOUNT counter value reaches the INTPOS value, the integrator start counter 170 changes the integrator signal delay signal INTD output to the integrator 140 from negative to positive, indicating that the integration window should begin, and then the integrator 140 integrates the rectified values for one carrier period. The cycle then repeats. The integration delay $T_{d,INT}$, which is the time value between the start or the change in sign (positive to negative) of the original carrier signal SGNS and the count value SDCOUNT reaches INTPOS, is stored in register INTCAP.

The microcontroller 100 may optionally comprise a global run control register (not shown) configured to align a start of the filter chain with a start of the carrier signal generator 110. The global run control register is basically a clock enable register to enable several channels with the same software access to eliminate bus access latency.

Figure 4:
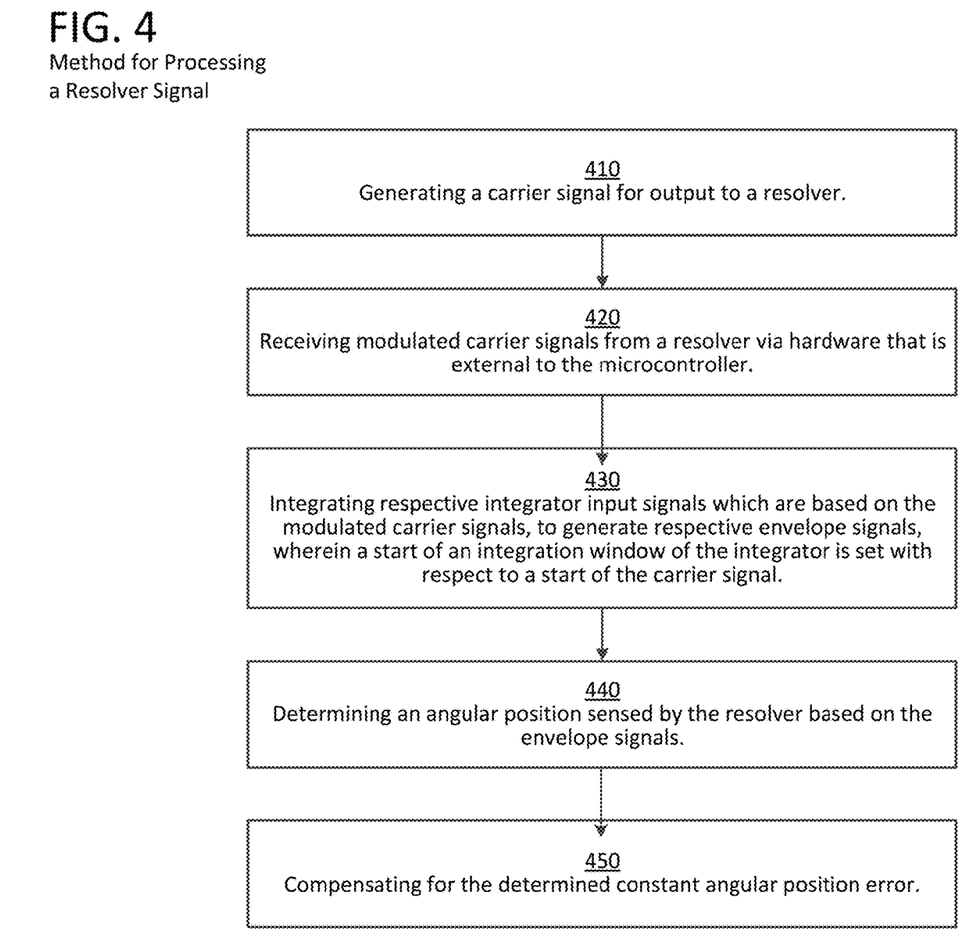
FIG. 4 illustrates a flowchart of a method for processing a resolver signal.

FIG. 4 illustrates a flowchart of a method 400 for processing a resolver signal by a microcontroller.

In step 410, a carrier signal generator 110 generates a carrier signal CS for output to a resolver 10.

In Step 420, modulated carrier signals are received from a resolver 10 via hardware 20 that is external to the microcontroller 100.

In Step 430, an integrator 140 integrates respective integrator input signals which are based on the modulated carrier signals, to generate respective envelope signals, wherein a start of an integration window of the integrator 140 is set with respect to a start of the carrier signal CS.

In Step 440, an angular position sensed by the resolver 10 is determined based on the envelope signals.

In Step 450, the determined constant angular position error is used by the microcontroller 100 to compensate for the constant angular position error.

With further regard to Step 430, it is possible to synchronize the start of the integration window of the integrator 140 with the start of the carrier signal CS without including the integrator start counter 170. Rather, the carrier signal CS may be started in fixed timing relation to a start of the filter chain (i.e., demodulator start). Using the SDCOUNT value discussed above, the external hardware delay may be calculated by multiplying the SDCOUNT value with the filter chain frequency, which is the data rate at the input of the integrator 140. The data rate depends on the filter settings of all filters upstream from the integrator 140. If the external hardware delay is zero, nothing is done. On the other hand, if there is an external hardware delay, the integrator 140 is switched off for the amount of the external hardware delay time.

This manner of synchronizing the start of integrator 140 with the start of the carrier signal CS without the integrator start counter 170 is performed during system runtime. The envelope signal information is thus stopped and restarted. For applications in which stopping the envelope signal information is not acceptable, redundant DSADCs may be used to provide the envelope signal information. In addition, the global run control register would have the carrier start signal, so it can align the demodulator start and the carrier start time.

The zero crossing point of the carrier signal CS is an easy point to identify as a fixed starting point of the carrier signal CS, but the disclosure is not limited in this respect. It is just important to delay, based on the external hardware delay, a start of the integration window of the modulated carrier signal so that it remains in synchronism with the delayed carrier signal and therefore with amplitude modulated signals.

Conventional microcontrollers have compromised angle accuracy due to the external hardware delay in the resolver loop. External hardware delays resulting from temperature changes and/or manufacturing variables result in variable delays and thus variable errors, making compensation using software difficult. The solutions disclosed herein significantly reduce system effort and/or costs for runtime calibrations.

The techniques of this disclosure may also be described in the following examples.

Example 1. A method for processing a resolver signal by a microcontroller, comprising: generating, by a carrier signal generator, a carrier signal for output to a resolver; receiving modulated carrier signals from a resolver via hardware that is external to the microcontroller; integrating, by an integrator, respective integrator input signals which are based on the modulated carrier signals, to generate respective envelope signals, wherein a start of an integration window of the integrator is set with respect to a start of the carrier signal; and determining an angular position sensed by the resolver based on the envelope signals.

Example 2. The method of example 1, wherein the start of the integration window of the integrator is set with respect to the start of the carrier signal by: if there is an external hardware delay, switching off the integrator beginning at the start of the carrier signal; and subsequently switching on the integrator after a time period corresponding with the external hardware delay.

Example 3. The method of example 2, further comprising: calculating the external hardware delay by multiplying a number of delay counts with an integrator input data period.

Example 4. The resolver signal processing method of example 2, wherein the start of the carrier signal corresponds with a zero crossing of the carrier signal.

Example 5. The method of example 1, wherein any angular position error related to the envelope signals is constant.

Example 6. The method of example 5, further comprising: using the determined constant angular position error to compensate for the constant angular position error.

Example 7. The method of example 1, further comprising: filtering, by a filter chain, the modulated carrier signals received from the resolver to generate respective filter chain signals upon which the integrator input signals are based.

Example 8. The method of example 7, further comprising: rectifying, by a rectifier, the filter chain signals to generate respective rectified filter chain signals which are the respective integrator input signals, wherein the rectifying is delayed with respect to the start of the carrier signal for a predetermined time period corresponding with a constant external delay.

Example 9. The method of example 7, further comprising: starting the filter chain in a fixed timing relation to starting the carrier signal generator.

Example 10. The method of example 1, further comprising: rectifying, by a rectifier, the modulated carrier signals received from the resolver to generate rectified signals which are the integrator input signals, wherein the rectifying is delayed for a predetermined time period with respect to the start of the carrier signal.

Example 11. A microcontroller for processing a resolver signal, comprising: a carrier signal generator configured to generate a carrier signal for output to a resolver; and an integrator configured to integrate integrator input signals to generate respective envelope signals by setting a start of an integration window with respect to a start of the carrier signal, wherein the integrator input signals are based on respective modulated carrier signals received from the resolver via hardware that is external to the microcontroller, and the envelope signals are for determining an angular position sensed by the resolver.

Example 12. The microcontroller of example 11, wherein the start of the integration window of the integrator is set with respect to the start of the carrier signal by the integrator being configured to: if there is an external hardware delay, switch off beginning at the start of the carrier signal; and subsequently switch on after a time period corresponding with the external hardware delay.

Example 13. The microcontroller of example 11, wherein any angular position error related to the envelope signal is constant.

Example 14. The microcontroller of example 11, wherein the start of the carrier signal corresponds with a zero crossing of the carrier signal.

Example 15. The microcontroller of example 14, further comprising: an integrator start counter coupled between the carrier signal generator and the integrator, and configured to measure the external hardware delay.

Example 16. The microcontroller of example 15, wherein the integrator start counter is configured to trigger the start of the integration window when the integrator start counter counts to a value representing the external hardware delay time following the start of the carrier signal.

Example 17. The microcontroller of example 11, further comprising: a filter chain configured to filter the modulated carrier signals received from the resolver to generate respective filter chain signals upon which the respective integrator input signals are based.

Example 18. The microcontroller of example 17, further comprising: a rectifier configured to rectify the filter chain signal to generate respective rectified filter chain signals which are the integrator input signals, wherein the rectifying is delayed with respect to the start of the carrier signal for a predetermined time period corresponding with a constant external hardware delay.

Example 19. The microcontroller of example 17, further comprising: a global run control register configured to align a start of the filter chain with a start of the carrier signal generator.

Example 20. The microcontroller of example 17, wherein the filter chain comprises a Delta-Sigma Analog-to-Digital Converter (DSADC) filter chain.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

The invention claimed is:

1. A method for processing a resolver signal by a microcontroller, comprising:
   generating, by a carrier signal generator, a carrier signal for output to a resolver;
   receiving modulated carrier signals from a resolver via hardware that is external to the microcontroller;
   integrating, by an integrator, respective integrator input signals which are based on the modulated carrier signals, to generate respective envelope signals, wherein a start of an integration window of the integrator is delayed to be in synchronism with a start of the carrier signal; and
   determining an angular position sensed by the resolver based on the envelope signals.

2. The method of claim 1, wherein the start of the integration window of the integrator is delayed to be in synchronism with the start of the carrier signal by:
   if there is an external hardware delay, switching off the integrator beginning at the start of the carrier signal; and
   subsequently switching on the integrator after a time period corresponding with the external hardware delay.

3. The method of claim 2, further comprising:
   calculating the external hardware delay by multiplying a number of delay counts with an integrator input data period.

4. The resolver signal processing method of claim 2, wherein the start of the carrier signal corresponds with a zero crossing of the carrier signal.

5. The method of claim 1, wherein any angular position error related to the envelope signals is constant.

6. The method of claim 5, further comprising:
   using the determined constant angular position error to compensate for the constant angular position error.

7. The method of claim 1, further comprising:
   filtering, by a filter chain, the modulated carrier signals received from the resolver to generate respective filter chain signals upon which the integrator input signals are based.

8. The method of claim 7, further comprising:
   rectifying, by a rectifier, the filter chain signals to generate respective rectified filter chain signals which are the respective integrator input signals, wherein the rectifying is delayed with respect to the start of the carrier signal for a predetermined time period corresponding with a constant external delay.

9. The method of claim 7, further comprising:
   starting the filter chain in a fixed timing relation to starting the carrier signal generator.

10. The method of claim 1, further comprising:
    rectifying, by a rectifier, the modulated carrier signals received from the resolver to generate rectified signals which are the integrator input signals, wherein the rectifying is delayed for a predetermined time period with respect to the start of the carrier signal.

11. A microcontroller for processing a resolver signal, comprising:
    a carrier signal generator configured to generate a carrier signal for output to a resolver; and
    an integrator configured to integrate integrator input signals to generate respective envelope signals by delaying a start of an integration window to be in synchronism with a start of the carrier signal, wherein the integrator input signals are based on respective modulated carrier signals received from the resolver via hardware that is external to the microcontroller, and the envelope signals are for determining an angular position sensed by the resolver.

12. The microcontroller of claim 11, wherein the start of the integration window of the integrator is delayed to be in synchronism with the start of the carrier signal by the integrator being configured to:
    if there is an external hardware delay, switch off beginning at the start of the carrier signal; and
    subsequently switch on after a time period corresponding with the external hardware delay.

13. The microcontroller of claim 11, wherein any angular position error related to the envelope signal is constant.

14. The microcontroller of claim 11, wherein the start of the carrier signal corresponds with a zero crossing of the carrier signal.

15. The microcontroller of claim 14, further comprising:
    an integrator start counter coupled between the carrier signal generator and the integrator, and configured to measure the external hardware delay.

16. The microcontroller of claim 15, wherein the integrator start counter is configured to trigger the start of the integration window when the integrator start counter counts to a value representing the external hardware delay time following the start of the carrier signal.

17. The microcontroller of claim 11, further comprising:
    a filter chain configured to filter the modulated carrier signals received from the resolver to generate respective filter chain signals upon which the respective integrator input signals are based.

18. The microcontroller of claim 17, further comprising:
a rectifier configured to rectify the filter chain signal to generate respective rectified filter chain signals which are the integrator input signals, wherein the rectifying is delayed with respect to the start of the carrier signal for a predetermined time period corresponding with a constant external hardware delay.

19. The microcontroller of claim 17, further comprising:
a global run control register configured to align a start of the filter chain with a start of the carrier signal generator.

20. The microcontroller of claim 17, wherein the filter chain comprises a Delta-Sigma Analog-to-Digital Converter (DSADC) filter chain.

\* \* \* \* \*